United States Patent
Aronson (10) Patent No.: US 7,453,338 B2
(45) Date of Patent: Nov. 18, 2008

(54) IMPEDANCE-MATCHING ELECTRICAL CONNECTION APPARATUS FOR HIGH-SPEED DATA COMMUNICATIONS SYSTEM

(75) Inventor: Lewis B. Aronson, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/533,676

(22) Filed: Sep. 20, 2006

(65) Prior Publication Data

US 2007/0015380 A1 Jan. 18, 2007

Related U.S. Application Data

(62) Division of application No. 10/285,772, filed on Nov. 1, 2002.

(60) Provisional application No. 60/366,092, filed on Mar. 19, 2002.

(51) Int. Cl.
*H03H 7/38* (2006.01)
*H05K 1/18* (2006.01)
(52) U.S. Cl. .................................. 333/260; 333/33
(58) Field of Classification Search ................ 333/246, 333/247, 260, 33, 34; 439/951, 947, 61, 439/62, 106; 438/106
See application file for complete search history.

(56) References Cited

U.S. PATENT DOCUMENTS

| | | | |
|---|---|---|---|
| 5,713,126 A * | 2/1998 | Sakemi | 29/843 |
| 5,760,650 A | 6/1998 | Faulkner et al. | 330/286 |
| 6,115,260 A * | 9/2000 | Nakajima et al. | 361/760 |
| 6,400,234 B1 | 6/2002 | Ohhashi et al. | |
| 6,549,413 B2 | 4/2003 | Karnezos et al. | 361/704 |

* cited by examiner

*Primary Examiner*—Stephen E Jones
(74) *Attorney, Agent, or Firm*—Workman Nydegger (57) ABSTRACT

This disclosure concerns systems and devices configured to implement impedance matching schemes in a high speed data transmission environment. In one example, an electrical connection system is provided that includes a circuit board upon which are disposed a one or more signal contact pads, each of which is configured to communicate with a complementary element of an external electrical device such that a respective shunt capacitance is defined. One or more of the signal contact pads define at least one open portion through which communication signals cannot pass. The open portions of the one or more signal contact pads are configured to reduce a shunt capacitance that is defined at the coupling of each signal contact pad and corresponding connector. As well, one or more signal lines are likewise disposed on the circuit board such that each signal line is connected to a respective one of the signal contact pads. The circuit board finally includes one or more ground contact pads and power contact pads.

28 Claims, 9 Drawing Sheets

Inductive Trace 504-1

Cross-hatched Signal Contact Pad 502-1

Cross-hatched Signal Contact Pad 502-n

Cross-hatched Signal Contact Pad 506-1

IMPEDANCE-MATCHING ELECTRICAL CONNECTION APPARATUS FOR HIGH-SPEED DATA COMMUNICATIONS SYSTEM

RELATED APPLICATIONS

This application is a division, and claims the benefit, of U.S. patent application Ser. No. 10/285,772, entitled APPARATUS FOR ENHANCING IMPEDANCE-MATCHING IN A HIGH-SPEED DATA COMMUNICATIONS SYSTEM, filed Nov. 1, 2002, which, in turn, claims the benefit of U.S. Provisional Patent Application Ser. No. 60/366,092, entitled APPARATUS FOR ENHANCING IMPEDANCE-MATCHING IN A HIGH-SPEED DATA COMMUNICATIONS SYSTEM, filed Mar. 19, 2002. All of the aforementioned patent applications are incorporated herein in their respective entireties by this reference.

BACKGROUND OF THE INVENTION

In designing high-speed communications system devices, such as high-speed optoelectronic transceivers, signal integrity is a paramount issue. With extremely fast signals and corresponding short bit periods, such as those utilized in a 10 Gb/s optoelectronic transceiver, even slight degradation of the signal can render the system unuseable. This is problematic because even relatively small transmission-line discontinuities can lead to significant signal degradation in a high-speed communications system.

One particularly problematic location for transmission line discontinuities in a high-speed communication system is the interface between two different electronic components, such as the interface between a plug-in module having an edge-card connector system and the edge-card connector on a host printed circuit board (PCB), or the interface between a surface-mounted chip and the PCB on which the chip is mounted. These types of interfaces tend to introduce discontinuities in the transmission path of the communication signals.

Figure 1:
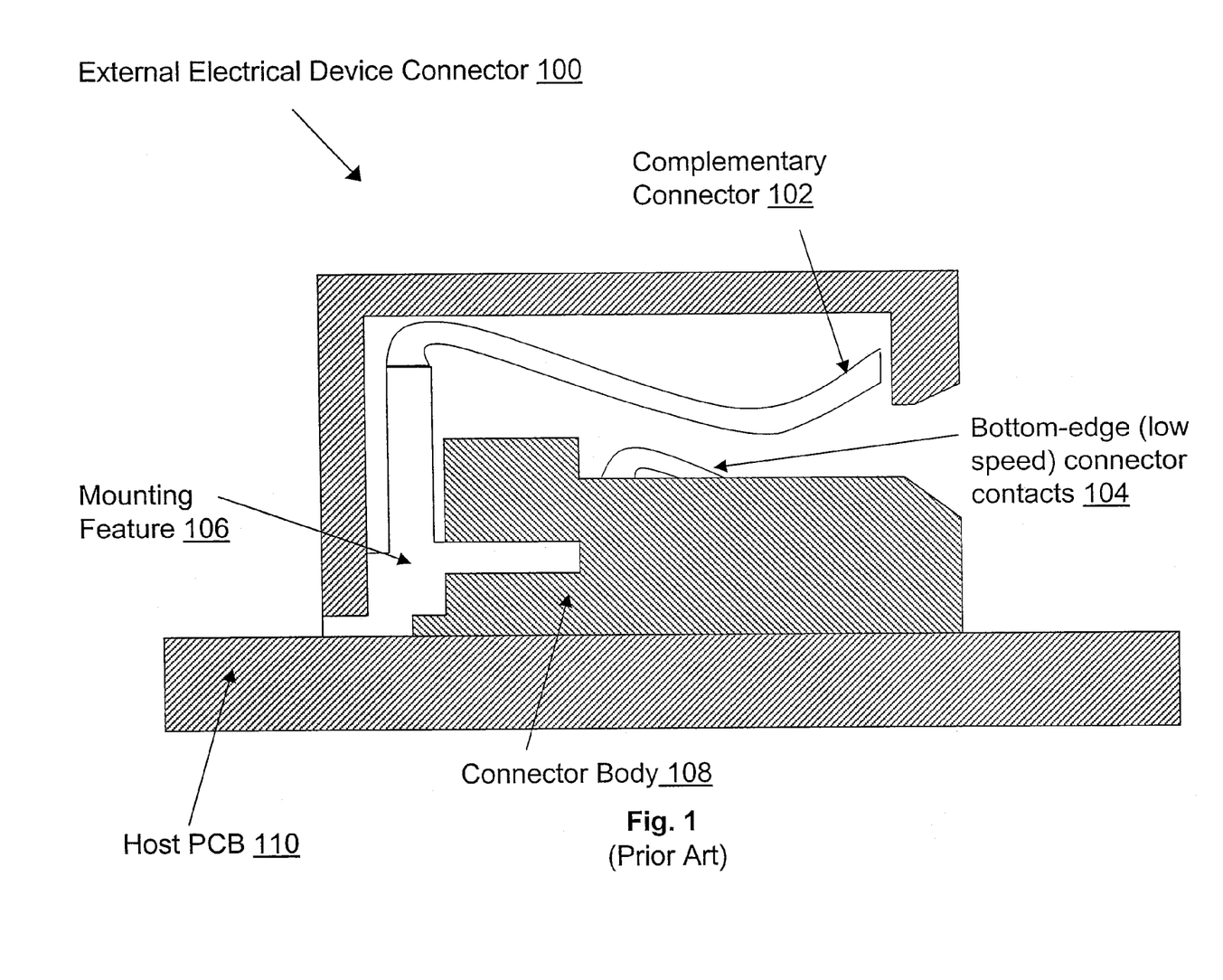
FIG. 1 is a schematic of a prior art connector unit having a connector arm for coupling with the contact points of an edge-card connector.
Figure 2:
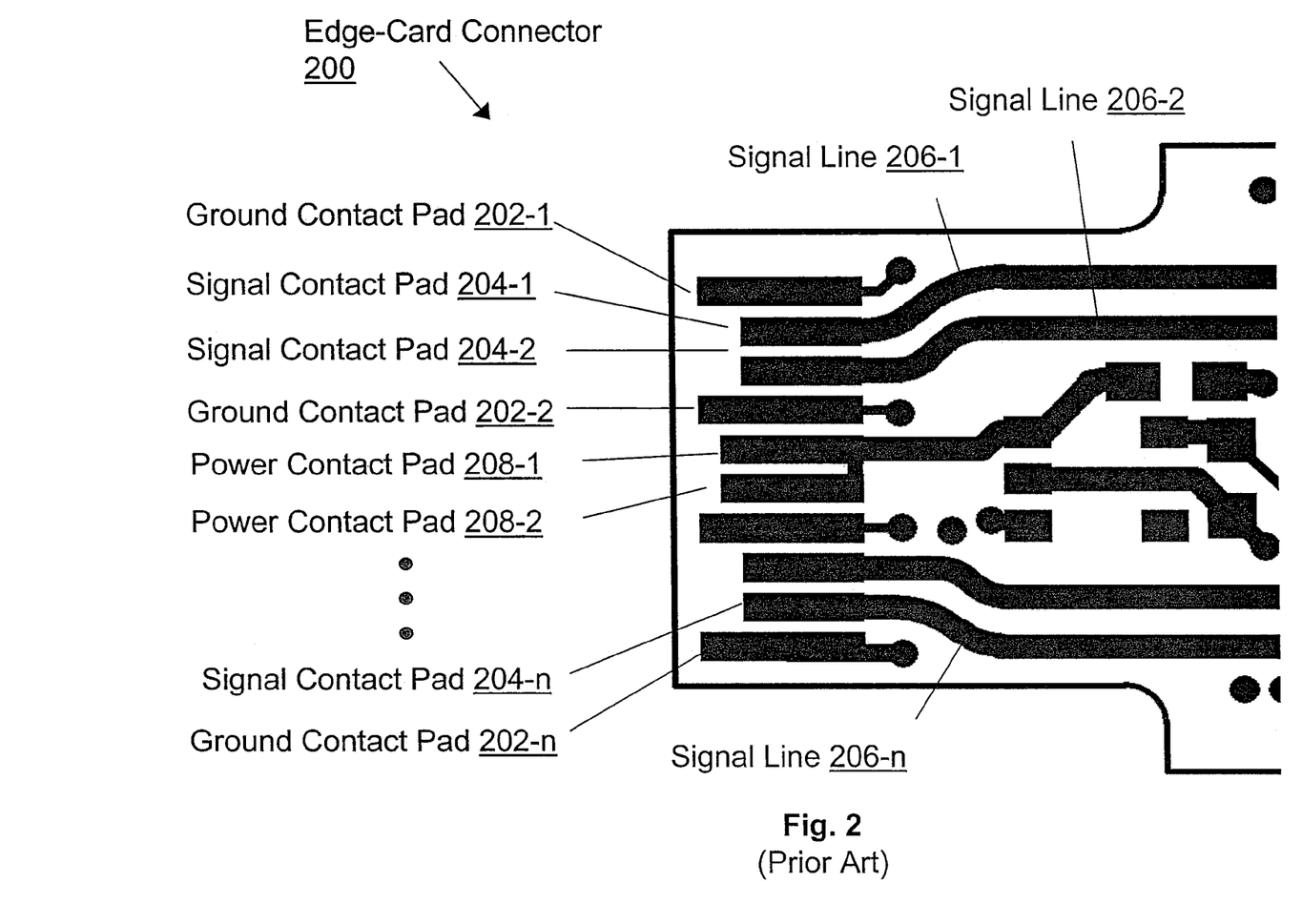
FIG. 2 is a schematic of a prior art edge-card connector having contact points that couple with the connector arms shown in FIG. 1.

For example, an edge-card connector system typically uses a series of spaced-apart contact pads on a plug-in card or module that engage and electrically couple to a series of spaced-apart complementary connectors in a connector unit on a separate PCB. An example of a connector unit is shown in FIG. 1, and an example of a plug-in card or module is shown in FIG. 2. This type of connection can be used with, for example, an optoelectronic transceiver that plugs into a host PCB. The edge-card connection mechanism, well-known in the art, makes mounting electronic cards and devices onto a host PCB solder-less and easy. It also tends to introduce discontinuities in the signals that pass through the complementary connectors into the contact pads and onto the card or module containing the contact pads. These discontinuities are likely caused by several features of the physical design of such a system.

In particular, some of the physical features used by an edge-card connector unit for structural support and connectivity purposes likely cause discontinuities in the signal transmission path. As illustrated in FIG. 1, external electrical device connector 100, also referred to as a connector unit, is typically comprised of a series spaced-apart complementary connectors, also referred to herein as contact points. (In the side plan view of FIG. 1, only one complementary connector 102 is depicted however). Each complementary connector 102 has a connector-arm portion (i.e., the top-most curving part of the complementary connector) that electrically couples with a contact pad on a card or module having an edge-card connector system. To mount complementary connector 102 in a perpendicular fashion to host PCB 110, the complementary connector must lock against connector body 108. This is typically accomplished using a mounting feature 106, which is shown in FIG. 1 as an integral mounting pin that fits into a mounting hole on the connector body. Other types of structural interlocking mechanisms in addition to a pin and hole pair are also commonly used.

The purpose of locking complementary connector 102 to connector body 108 is to provide additional structural stability for the complementary connector 102. However, this design also likely adds undesirable electrical effects into the transmission path of electric signals conducting through the complementary connector. Because complementary connector 102 is a conductor, mounting feature 106 is also typically a conductor, due to manufacturing requirements. Thus, mounting feature 106 adds increased planar surface areas to the transmission path. This, in effect, adds excess shunt capacitance to the transmission path, relative to the nominal capacitance of the path. (A transmission path has a nominal impedance per unit length—e.g., 50 ohms in a single-ended transmission path—and, relatedly, a nominal series inductance and shunt capacitance per unit length). This excess shunt capacitance is also referred to as parasitic capacitance. This undesirable capacitance results from interaction with other portions of the path, such as with the connector arm portion of complementary connector 102, and with the grounding plane (now shown in FIG. 1).

Another possible source of unwanted discontinuities is the connector arm portion of complementary connector 102. When a plug-in card or module is slipped into the opening shown on the right side of external electrical device connector 100, the contact pads on the top of the card will couple with the complementary connector 102, and the contact pads on the bottom of the card will couple with the bottom-edge connector contacts 104 (typically used for low-speed communications). To ensure that complementary connector 102 reliably and easily mates with a contact pad, the connector arm portion presents a convex surface relative to the contact pad. Using this particular design, the contact pads of a plug-in card or module can easily be slid along the connector arm portion of the complementary connector 102, providing an electrical coupling without impeding the movement of the plug-in card or module. Depending on the angle of the complementary connector 102 relative to the plane of the plug-in card, the complementary connector can also provide additional support and resistance against extraneous movement by the plug-in card. However, this layout also causes part of the complementary conductor, and hence the transmission path, to extend past, and up and away from, the actual point of contact with a contact pad (i.e., because of the "hooked" end). Like with the mounting feature 106, this causes parasitic shunt capacitance to appear in the transmission path in excess of the nominal shunt capacitance associated with the transmission path.

Referring to FIG. 2, a typical edge-card connector 200 is shown. Printed on a circuit board are a series of spaced-apart contact pads. As shown in FIG. 2, the contact pads may include ground contact pads 202-1, 202-2 . . . 202-n, signal contact pads 204-1, 202-3 . . . 204-n, and power contact pads 208-1, 208-2. The ground contact pads are typically longer than the signal contact pads to allow for hot-plugging of the edge-card connector by ensuring that the system is grounded before power and signal connections are made. The ground contact pads generally connect to a trace extending a short distance beyond the ground contact pad, which then connects to a connector going downward to a (typically) internal ground plane, separated from the top surface by a dielectric material.

The signal contact pads of the edge-card connector connect to a signal line, such as signal lines 206-1, 206-2 . . . 206-n. The signal contact pads are typically wider than the signal wires. The purpose of having contact pads with a wide surface area is to facilitate an easy coupling with a complementary connector, because the connector need only contact any portion of the wide surface area to establish an electrical connection. However, it is likely that this extra surface area also increases the shunt capacitance between each contact pad and the ground place, as well as between the contact pads themselves, resulting in excess, parasitic shunt capacitance that causes the aforementioned transmission-line discontinuities.

Edge-card connector 200 will also typically include at least one contact pad for power, such as power contact pads 208-1 and 208-2, at a predetermined voltage level. The length of the power contact pads tends to be intermediate the length of the ground contact pads and the length of the signal contact pads, again to allow for hot-plugging to ensuring that the edge-card connector system is powered before signaling connections are made (but only after grounding has been achieved). Of course, the card containing the edge-card connector will also include various electrical components, such as resistors, capacitors, potentiometers, inductors, diodes, etc. These components will typically be interconnected through various traces and signal lines, and are typically utilized in the transmission path as well. The card may also contain, or comprise, other specialized components, such as optoelectronic components, processors, ASICs, and the like.

Regardless of the purpose of the plug-in card or module on which an electrical connection system is mounted, it would be desirable to provide an electrical connection system that reduces discontinuities in the transmission path through the interface between the plug-in card and the hose PCB.

BRIEF SUMMARY OF AN EXEMPLARY EMBODIMENT OF THE INVENTION

In general, exemplary embodiments of the invention are concerned with systems and devices configured to implement impedance matching schemes in a high speed data transmission environment. In one example, an electrical connection system is provided that includes a circuit board upon which are disposed a one or more signal contact pads, each of which is configured to communicate with a complementary element of an external electrical device such that a respective shunt capacitance is defined. One or more of the signal contact pads define at least one open portion through which communication signals cannot pass. The open portions of the one or more signal contact pads are configured to reduce a shunt capacitance that is defined at the coupling of each signal contact pad and corresponding connector. As well, one or more signal lines are likewise disposed on the circuit board such that each signal line is connected to a respective one of the signal contact pads. The circuit board finally includes one or more ground contact pads and power contact pads.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 3:
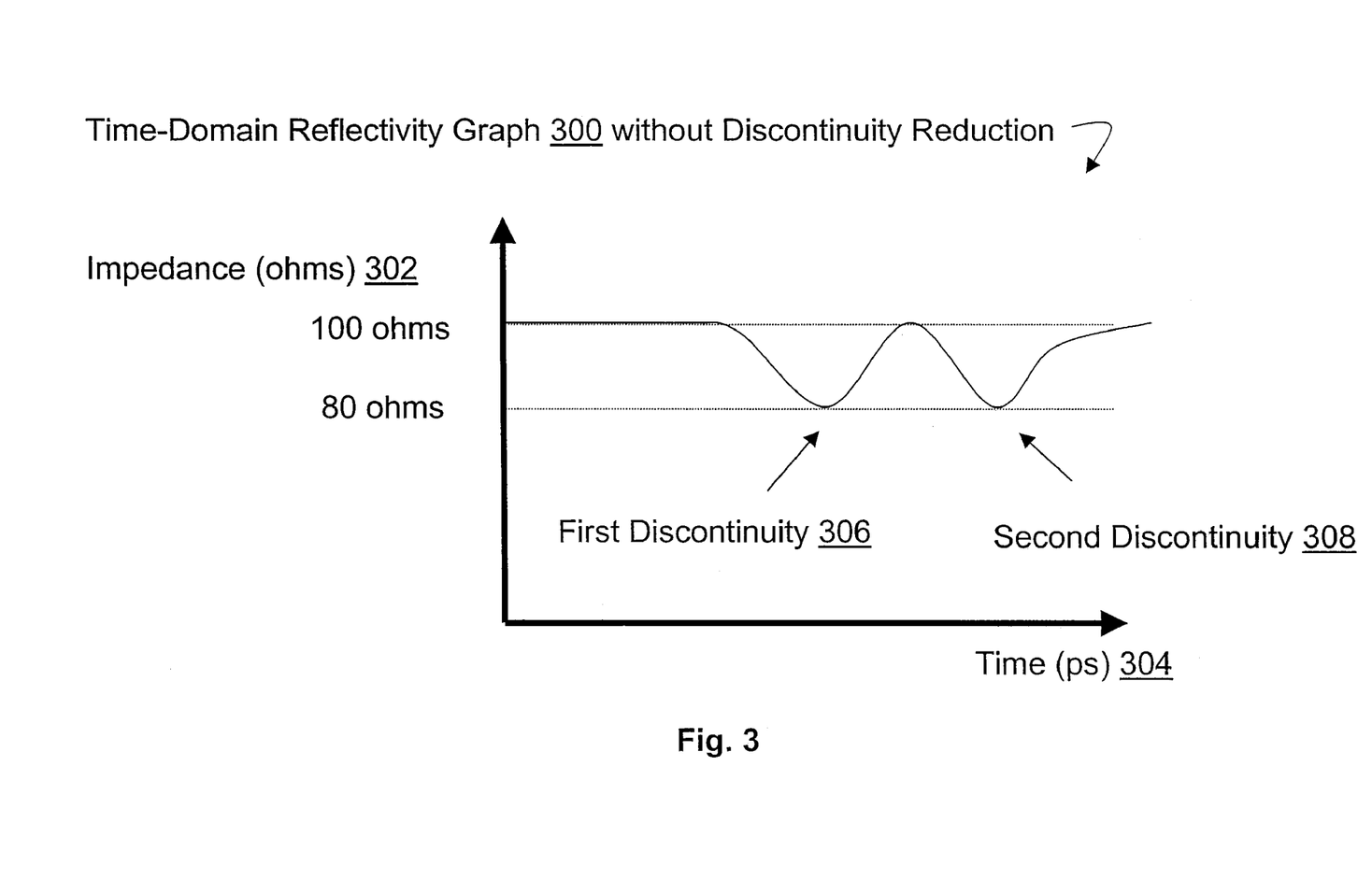
FIG. 3 is a graph of a typical differential time-domain reflectivity measurement, displaying impedance versus time, measured at the interface between a prior art connector unit and a prior art edge-card connector system.

Referring to FIG. 3, a time-domain reflectivity graph is depicted that demonstrates the effects of the discontinuities of an existing edge-card connector system, described above. This graph was obtained by transmitting a sharp edge with a very fast rise time, 40 ps, across a transmission path including an interface between an edge-card connector and a connector unit of a host PCB. A very fast rise time was utilized because the discontinuities described above are only problematic and significant in high-speed systems, i.e., in systems communicating at an extremely fast data transmission rate, such as 5 Gb/s and above. (In fact, these discontinuities may not even be seen in systems operating at 1 or 2 Gb/s, or may only be seen as a single discontinuity that cannot be spatially resolved into separate discontinuities at the lower transmission rates). The particular edge-card connector tested was part of a plug-in card or module containing an optical transceiver device. An example of an optical transceiver utilizing an edge-card connector design is the Small Form Factor Pluggable (SFP) transceiver, developed under a Multisource Agreement (MSA) and manufactured by the present assignee, Finisar Corporation, among others.

The output pulse and return signal measurements were made by a time-domain reflectometer (TDR). The system measured a different transmission path having a 50 ohm nominal impedance path on each line, resulting in the 100 ohm impedance seen in the graph. The actual time-domain reflectivity measurement was made by measuring a voltage return signal as a function of time, but in FIG. 3 it has been converted to, and is displayed as, impedance (in ohms) 302 against time (in picoseconds) 304. The measurement may also be viewed as impedance versus distance (position) in the transmission path, because the time value reflects the amount of time the signal traveled before being reflected and measured, therefore indicating a distance from the point of measurement on the transmission path.

As shown in FIG. 3, the measured differential impedance is 100 ohms starting at time zero, representing the fact that the impedance measurement is made far enough down the transmission path so as not to reflect the initial transmission path impedance ramp-up at the point the test voltage is applied to the path. In other words, the nominal impedance of the differential transmission path is meant to be a constant 100 ohms. However, a first discontinuity 306 undesirably reduces the impedance by about 20%, to approximately 80 ohms. One possible source for such a discontinuity would be the mounting feature 106 described in FIG. 1. This discontinuity causes reflections that result in signal degradation, as the impedance in the transmission path is no longer impedance-matched at this location.

Beyond the source of this first discontinuity, the impedance returns to the nominal 100 ohms, but then dips down again at a second discontinuity 308, again by about 20%, to approximately 80 ohms. A possible cause of the second discontinuity might be the extension of the complementary connector 102 beyond the point of coupling with a contact pad, as described for FIG. 1, or it may be the geometry of a signal contact pad, describe for FIG. 2, or possibly a combination of both. In any case, the second discontinuity 308 can be considered to be associated with the coupling between a contact pad and a complementary connector. Like with the first discontinuity, this second discontinuity causes further signal degradation.

In FIG. 3, the first and second discontinuities are approximately the same magnitude. However, depending on the specific parameters of the system being utilized, the discontinuities may be of unequal magnitudes, and may be spaced further apart, or may be closer together. In addition, there may be more than two distinct discontinuities. For example, the second discontinuity 308 may actually be two separate discontinuities, of equal or unequal magnitude, spaced close enough together to be partly merged. This result may reflect the possible different sources of a second discontinuity, such as the extension of the complementary connector beyond the coupling point, and the increased surface area of a signal contact point. Again, for purposes of this document, the second discontinuity is considered to be associated with the general coupling between a contact pad and a complementary connector.

Figure 4:
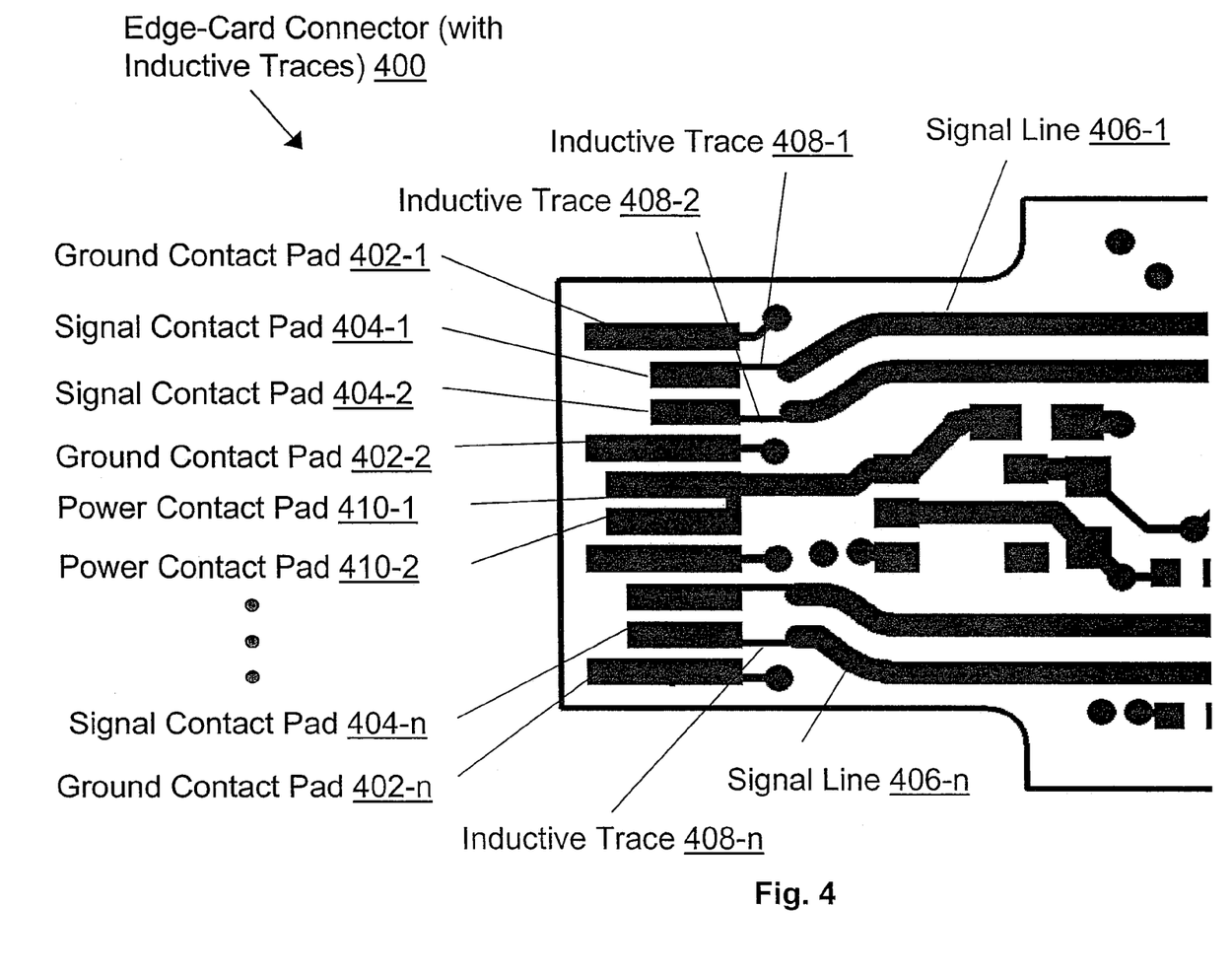
FIG. 4 is a schematic demonstrating an edge-card connector with inductive traces, in accordance with one embodiment of the present invention.

One possible way to reduce at least the second discontinuity in the transmission path is shown in FIG. 4. In this embodiment of the present invention, an edge-card connector having inductive traces 400 is shown. (This embodiment, as well as other related embodiments, are also referred to herein as an impedance-matching electrical connection system, or a discontinuity-reducing electrical connection system.) An inductive trace is a portion of a trace that has a narrower width than a contact pad or a signal line, similar to a bond wire. Due to the narrow width of an inductive trace, each inductive trace has a higher series inductance relative to the nominal series inductance of its associated transmission path (and, relatedly, a higher impedance than the nominal impedance of the associated transmission path). This increased series inductance can be used to substantially offset the undesirable (i.e., excess) shunt capacitance from the coupling between a contact pad and a complementary connector. In this case, the series inductance of an inductive trace wire is used as a compensating series inductance.

Preferably, the substantial offset of the undesirable shunt capacitance by the inductive traces, either along or in combination with other embodiments of the present invention, is at least 50%, and preferably is at least 75%. In other words, if excess shunt capacitance is reducing the connector impedance by 20 ohms (for signals in a predetermined frequency range), from 100 ohms to 80 ohms, then the offset produced by the inductive traces is at least 10 ohms, producing a net impedance of at least 90 ohms, and preferably producing a net impedance of at least 95 ohms.

As shown in FIG. 5, inductive traces 408-1, 408-2 ... 408-$n$ connect to a respective signal contact pad 404-1, 404-2 ... 404-$n$. the "trick" to offsetting the excess shunt capacitance of a coupling with the compensating series inductance of an inductive trace is to place the inductive trace close enough to the coupling to cause the decrease in impedance from the excess shunt capacitance, and the increase in impedance from the series inductance, to effectively cancel each other out. This is accomplished by placing an inductive trace (e.g., 408-1) adjacent to the signal contact pad (e.g., 404-1). Also, the inductive trace cannot be too long, or its compensating series inductance will not overlap the excess shunt capacitance, and thus will not effectively cancel out the excess shunt capacitance associated with a coupling. This effect would be revealed in a time-domain reflectivity graph as a third discontinuity—a bump (as opposed to the dips of the other two discontinuities) in the graph reflecting an increased transmission line impedance from the unmatched compensating series inductance of the inductive trace.

To achieve optimal discontinuity-reduction and yet avoid overcompensation, both he width and the length of the inductive traces are configured appropriately. In one embodiment, a typical inductive trace is 4 to 6 mils (i.e., 0.004 to 0.006 inches) wide, and less than 40 mils long, while the signal traces are typically 17 to 23 mils wide. Or, from another perspective, the width of each inductive trace is not greater than 35% of the width of the signal line to which the inductive trace is connected, and preferably, is not greater than 25% of the width of the signal line to which the inductive trace is connected.

The inductive traces 408-1, 408-2 ... 408-$n$ also connect to the signal lines 406-1 ... 406-$n$. Note that not all types of contact pads utilize an inductive trace. For example, power contact pads 410-1 and 410-2, which are actually linked together, do not utilize inductive traces. Ground contact pads 402-1, 402-2 ... 402-$n$ may link to traces, which may or may not be used to reduce excess shunt capacitance. In other embodiments (not shown), one or more of the signal contact pads may not utilize an inductive trace, and may instead connect directly to a signal line, such as in the case of a lower-speed data transmission line, for which the use of an inductive trace may be unnecessary or unhelpful. The invention encompasses using inductive traces intermediate all connections between signal contact pads and signal lines, or using a combination of intermediate inductive traces and no inductive traces (i.e., a direct connection between contact pad and signal line).

Figure 5A:
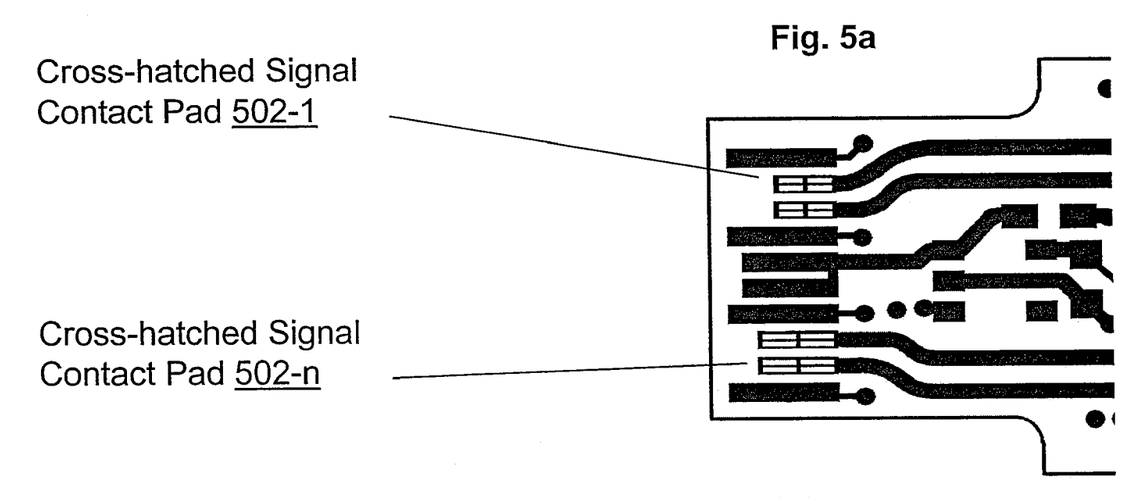
FIG. 5a is a schematic of an edge-card connector having cross-hatched signal pads in accordance with a second embodiment of the present invention.

Referring to FIG. 5$a$, another embodiment of the present invention is shown. In this embodiment, the undesirable shunt capacitance associated with a coupling between a contact pad and a complementary connector is reduced by reducing the total surface area of a signal contact pad. However, instead of directly reducing the outside dimensions of the contact pad, which would reduce the ability of a contact pad to reliably couple with a complementary connector, the surface area of a contact pad is reduced via certain surface area geometries. For example, as shown in FIG. 5$a$, cross-hatched signal contact pads 502-1 . . . 502-n are utilized. By removing four "windows" (i.e., parallelograms) of surface area, the original outline of the contact pad is maintained (i.e., the original width and length), but the total surface area is reduced, because the remaining surface area is less than the product of the width and the length. In one embodiment, at least 50% of the total surface area of the signal contact pads are removed (there is no reason to adjust the ground contact pads, as they do not constitute part of the signal transmission path). By reducing the surface area in this manner, the excess shunt capacitance is reduced, while sufficient surface area is maintained for the complementary connector to couple with the contact pad.

Figure 5B:
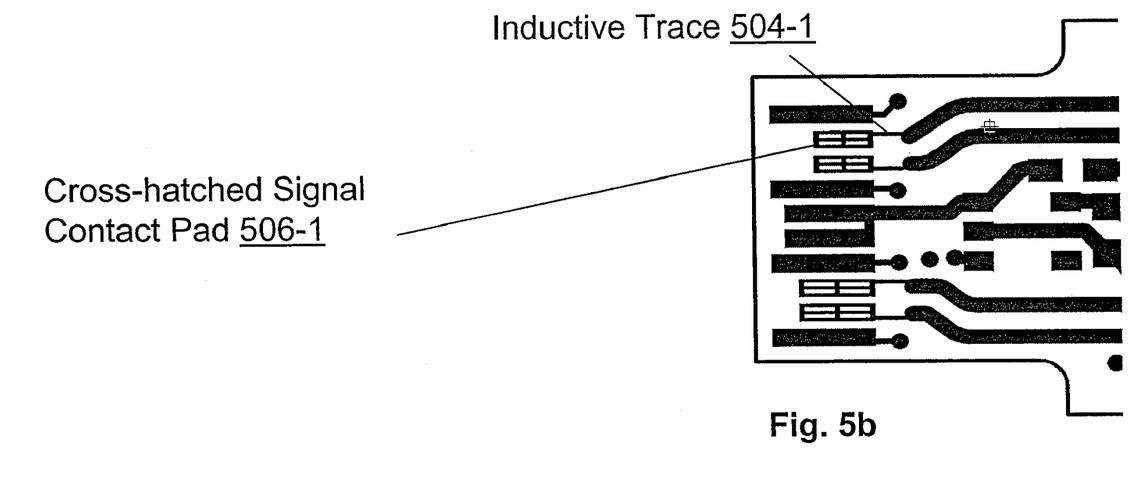
FIG. 5b is a schematic of an edge-card connector utilizing both cross-hatched signal contact pads and inductive traces in accordance with yet another embodiment of the present invention.

The embodiment can be further enhanced by combining it with the inductive trace embodiment described in conjunction with FIG. 4. This is depicted in FIG. 5b, which includes a cross-hatched signal contact pad 506-1 connected to an inductive trace 504-1. By utilizing both techniques to reduce the excess shunt capacitance associated with the coupling between the contact pad and a complementary connector, even greater discontinuity reduction, or improved impedance matching, in the transmission path is achieve.

For example, in the external electrical device containing the complementary connectors, at least one of the complementary connectors will connect to an external transmission line (e.g., signal lines on the host PCB). This external transmission line(s) will have a nominal impedance. Similarly, the cross-hatched signal contact pad 506-1 and inductive trace 504-1 shown in FIG. 5b will have, jointly, an average impedance, which is based at least in part on the excess shunt capacitance associated with the coupling of the contact pad 506-1 and the complementary connector, and the compensating series inductance of the inductive trace 504-1. The average impedance of this combination is ideally configured to be substantially equivalent to the nominal impedance of the external transmission line on the host PCB, and preferably is within 10% of this nominal impedance.

Another way to consider the impedance-matching functionality of the present invention is to consider that each inductive trace, and the contact pad connected to it, are configured to provide substantial impedance matching to a coupling complementary connector. Again, preferably the impedance-matching is within 10% of the nominal impedance. However, in addition to configuring the inductive trace and the contact pad connected thereto to impedance-match the complementary connector, these components must also be configured to provide substantial impedance matching to the signal line connected to the inductive trace. Otherwise, while improving one discontinuity in the transmission path, the inductive trace and modified contact pad could cause another. In one embodiment, these types of impedance matching are achieved at data transmission rates of 10.0 Gb/s and higher, and more generally above 5.0 Gb/s and higher, because the discontinuities in transmission line impedance are most typically seen at these high-speed transmission rates.

Figure 6A:
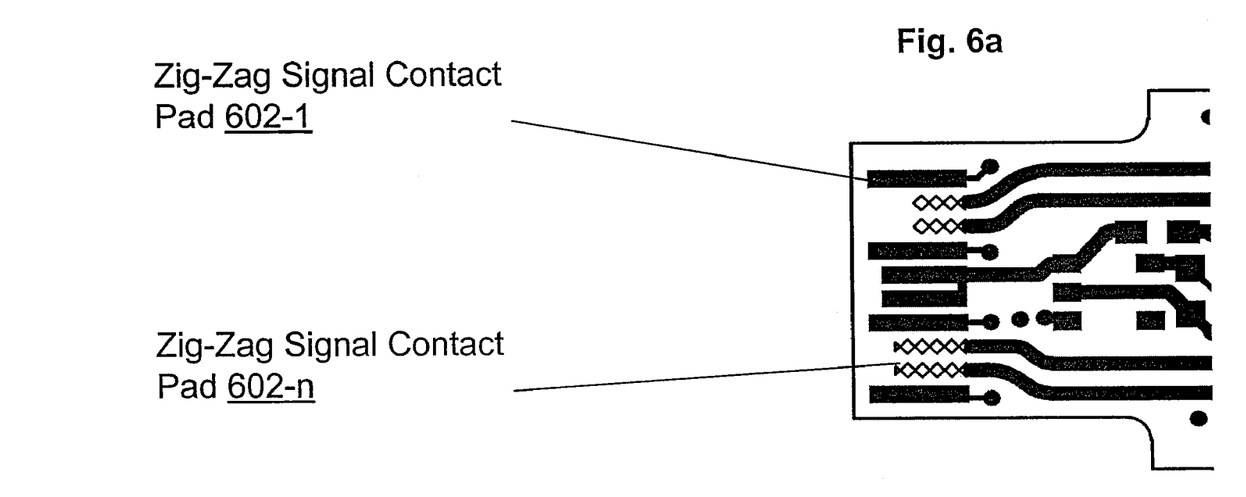
FIG. 6a is an exemplary embodiment of the present invention utilizing zig-zag-patterned signal contact pads.
Figure 6B:
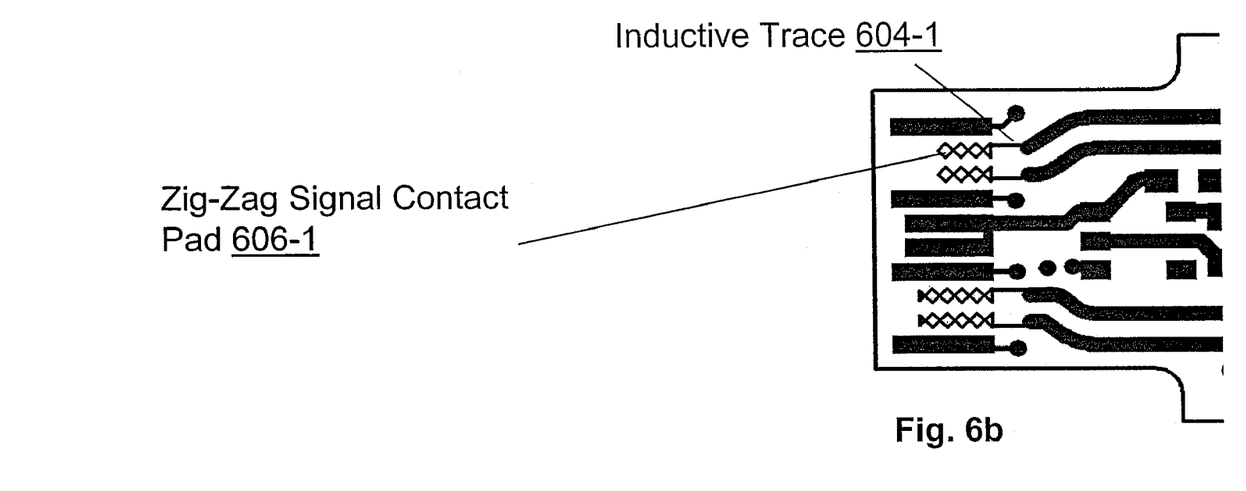
FIG. 6b is another exemplary embodiment utilizing both zig-zag-patterned signal contact pads, as well as inductive traces.

Other patterns for the surface area geometries of the signal contact pads are possible. For example, as shown in FIG. 6a, zig-zag patterned signal contact pads 602-1 . . . 603-n can be utilized. Again, the net effect is to reduce the total surface area, preferably by at least 50%, and more preferably by least 75%, while maintaining a substantial surface profile for easy coupling with a complementary connector. Also, as shown in FIG. 6b, a zig-zag patterned signal contact pad 606-1 can be combined with the inductive trace 604-1 technique to further reduce discontinuities by improving impedance matching.

Figure 7:
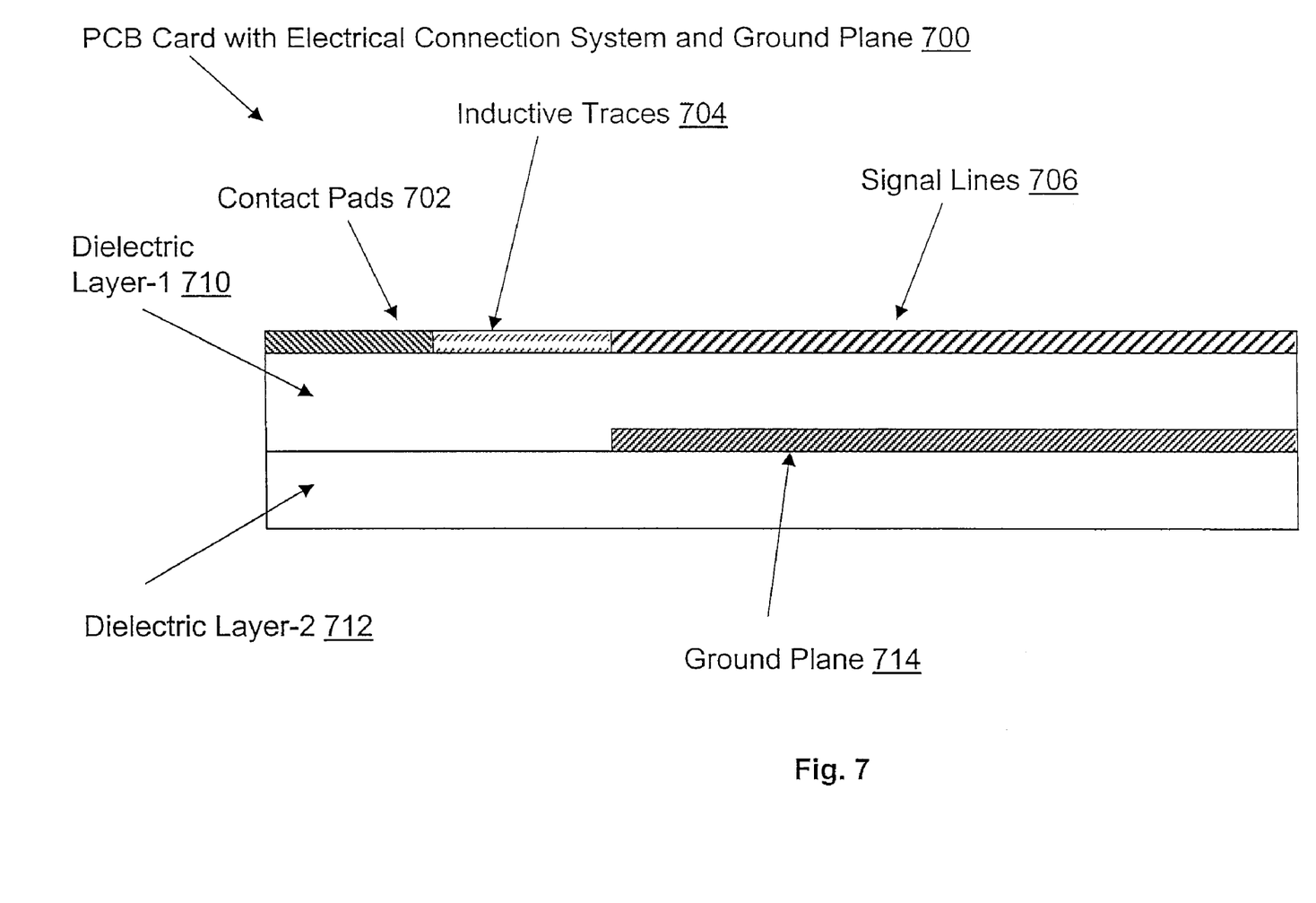
FIG. 7 is a schematic showing a cross-section of a circuit board having elements of one embodiment of the present invention, including a shortened ground plane.

As mentioned above, a typical circuit board containing the electrical connection system of the present invention will also contain a grounding plane that runs parallel to the top surface of the circuit board. This is shown in FIG. 7 as a PCB card with electrical connection system and ground plane 700. The actual grounding plane 714 is generally on an opposite side of a dielectric layer (e.g., dielectric layer-1 710) from the contact pads 702, inductive traces 704, and signal lines 706, and is typically internal to the circuit board (e.g., encapsulated by dielectric layers 1 and 2, 710 and 712). (By keeping the ground plans proximate to the contact pads and signal lines, the features of the transmission path can be kept at a reasonable width while still achieving the desired nominal transmission line impedance).

As shown in this figure, another method to reduce the excess shunt capacitance associated with the coupling between the contact pads and the complementary connector is to have the ground plate 714 not extend into a region below at least a subset of the set of contact pads 702. This decreases the capacitive field between contact pads 702 and ground plane 714 through dielectric layer-1 710. Preferably, the ground plane 714 does not extend into a region below any of the signal contact pads of the card. In another embodiment, the ground place further does not extend into a region below at least a subset of the set of inductive traces 704. This further decreases the strength of the capacitive field surrounding the inductive traces, and hence increases their inductance.

In the embodiment shown in FIG. 7, the ground place extends only under the signal lines 706. While the ground plane is shown ending directly at a plane perpendicular to the intersection of the signal lines 706 and the inductive traces 704, in various embodiments the ground plane may extend somewhat past this line, or may end somewhat before it. The actual configuration can be adjusted to achieve maximum discontinuity-reduction, or impedance-matching, in conjunction with either the specialized surface area geometry techniques, or the inductive trace techniques, or both, of the present invention.

Figure 8:
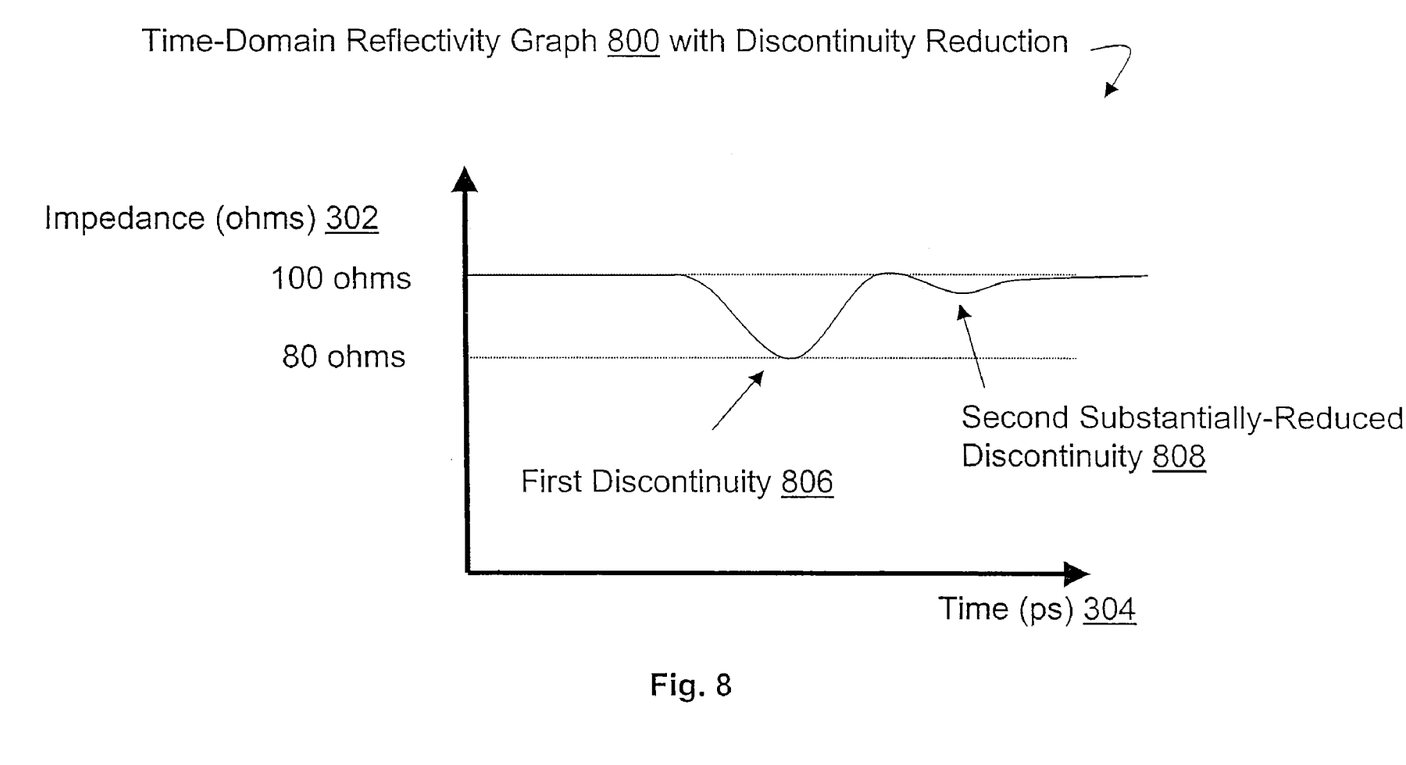
FIG. 8 is another graph of a differential time-domain reflectivity measurement, similar to FIG. 3, but demonstrating the effects of utilizing an embodiment of the present invention.

The overall improvement in discontinuity reduction, or impedance matching, from these techniques is depicted in the impulse response graph 800 shown in FIG. 8. This graph was generated under the same conditions as the graph in FIG. 3, and uses the same axes. However, the electrical connection system tested for FIG. 8 employed the inductive traces and the specialized contact pad surface area geometries of one embodiment of the present invention. As a result, the second substantially-reduced discontinuity 808 is within about 5% of the transmission impedance—about 95 ohms (the nominal impedance is 100 ohms, based on using differential signaling in a nominal 50 ohm transmission path). Clearly, the excess shunt capacitance associated with the couplings between the contact pads and the complementary connectors has been substantially offset by the compensating series inductance of the inductive traces, and reduced by the specialized surface area geometries of the contact pads and the shortened ground plane.

In one embodiment demonstrating one particular use of the present invention, the invention is an optoelectronic device for use in a high-speed communications system. The host PCB on which the electrical connection system described above is mounted includes at least one optoelectronic component, e.g., an optoelectronic transceiver, and a housing at least partially enclosing the structure, creating a pluggable transceiver.

One particular advantage of using the present invention in a pluggable transceiver is that the entire device can be kept very small. This is because high-speed serial interconnects, such as the couplings of the present invention, reduce the need for power- and space-intensive multiplexers, such as those used in the larger optoelectronic transponders. However, high-speed interconnects are also prone to the transmission-path discontinuities described herein, and therefore benefit greatly from the use of the discontinuity-reduction technology of the present invention. In this sense, the discontinuity-reduction of the present invention makes the use of optoelectronic devices without multiplexors much more feasible. Thus, in one embodiment, the physical dimensions of the optoelectronic device of the present invention are as follows: width, 3 cm or less; length, 6.5 cm or less, and height, 1 cm or less. In an alternate embodiment, the physical dimensions of the optoelectronic device are: width, 0.54 inches or less; length, 2.24 inches or less; and height, 0.34 inches or less.

Another advantage of the present invention for a pluggable optoelectronic transceiver is improved signal integrity in a high-speed communications system operating at data transmissions rates of 5.0 Gb/s and above, and preferably 10 Gb/s and above. Preferably, the pluggable optoelectronic transceiver uses one or more high-speed differential signal paths.

Figure 9:
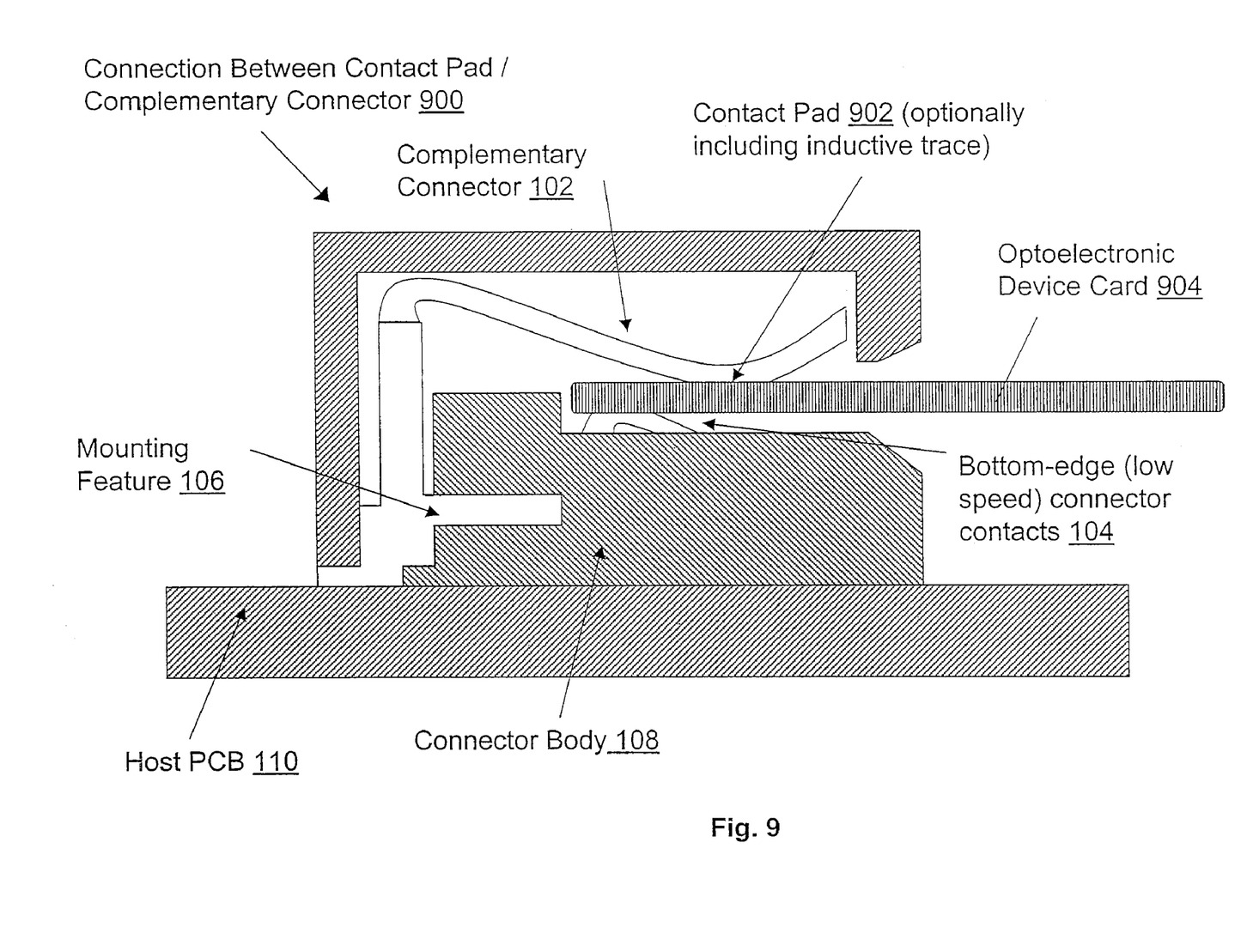
FIG. 9 is a schematic of a connector unit, similar to FIG. 1, and an edge-card connector having features of the present invention plugged into the connector unit, in accordance with one embodiment of the present invention.

An example of a coupling between a pluggable optoelectronic device and an external electrical device (such as a host PCB) is shown in FIG. 9. Specifically, FIG. 9 depicts the connection between a contact pad and a complementary connector 900. (There would actually be a series of such connections between a connector unit and an edge-card connector system). The same features of the external electrical device (i.e., connector unit) of FIG. 1 are shown in FIG. 9. In addition, optoelectronic device card 904 has been inserted into the slot formed on the right-hand side of the connector unit. Contact pad 902 (not explicitly shown as a raised surface) on the optoelectronic device card 904 is electrically coupled to the complementary connector 102. Also, if there are bottom contact pads on the optoelectronic device card 904, a bottom contact pad is electrically coupled to the bottom-edge (low speed) connector contacts 104.

Contact pad 902 may have one of the specialized surface area geometries described above, in accordance with an embodiment of the present invention. In addition, or in the alternative, contact pad 902 may also connect to an inductive trace (not shown explicitly as a raised surface) Furthermore, the shortened ground plane shown in FIG. 7 may be utilized in optoelectronic device card 904. The effect of a specialized surface area geometry for contact pad 902, and/or a connected inductive trace, and/or a shortened ground plane, would be similar to the results shown in the graph at FIG. 8.

The electrical connection system of the present invention is suitable for use with many types of electrical and electronic devices other than optoelectronic devices, including processors, ASICs, electrical interfaces, discrete electronic components, and the like. It is particularly advantageous in both single-ended and double-ended transmission paths.

While the present invention has been described with reference to a few specific embodiments, the description is illustrative of the invention and is not be construed as limited the invention. Various modifications may occur to those skilled in the art without departing from the true spirit and scope of the invention as defined by the appended claims.

What is claimed is:

1. An electrical connection system for use in connection with high frequency communication signals, comprising:
    a circuit board;
    a plurality of signal contact pads included on the circuit board, wherein one of the signal contact pads defines a plurality of open portions such that the signal contact pad with the plurality of open portions is configured to provide a reduction in shunt capacitance, relative to a shunt capacitance associated with a signal contact pad without a plurality of open portions, at least one of the open portions being defined at a coupling between the signal contact pad and a corresponding connector of an electrical device when the circuit board is fully inserted into a receptacle of the electrical device;
    a plurality of signal lines included on the circuit board, the signal lines operably connected to respective signal contact pads of the plurality of contact pads; and
    a ground contact pad included on the circuit board, the ground contact pad being substantially free of any open portions.

2. The electrical connection system as recited in claim 1, wherein each signal contact pad of the plurality of signal contact pads defines a plurality of open portions.

3. The electrical connection system as recited in claim 1, wherein the at least one signal contact pad having the at least one open portion defines a total conductive area that is substantially less than at least one of the signal contact pads not having at least one open portion.

4. The electrical connection system as recited in claim 1, further comprising a plurality of inductive traces interposed between and operably connected to each signal line and the respective signal contact pad, each inductive trace having a width that is substantially less than a width of the respective signal line to which the inductive trace is operably connected.

5. The electrical connection system as recited in claim 4, wherein each inductive trace defines a compensating series inductance that reduces the shunt capacitance defined at the coupling of each signal contact pad and the corresponding connector of the electrical device.

6. An electrical connection system suitable for use in connection with high-frequency communication signals, the electrical connection system comprising:
    a circuit board;
    a plurality of signal contact pads disposed on the circuit board and configured to interact with complementary elements of an electrical device such that a coupling between one of the signal contact pads and one of the complementary elements is defined that has an associated shunt capacitance, wherein the signal contact pad associated with the coupling defines at least one open portion through which signals would pass when the electrical connection system is in a fully coupled configuration, but for an absence of conductive material in the at least one open portion;
    a non-data contact pad disposed on the circuit board and configured to interact with a complementary element of the electrical device, the non-data contact pad being substantially free of any open portions;
    a plurality of inductive traces disposed on the circuit board and connected to the plurality of signal contact pads, one of the inductive traces having an associated compensating series inductance that substantially offsets at least a portion of a corresponding shunt capacitance associated with that inductive trace; and
    a plurality of signal lines disposed on the circuit board and connected to the plurality of inductive traces.

7. The electrical connection system as recited in claim 6, wherein the electrical connection system is compatible for use with one or more high-speed differential signal paths.

8. The electrical connection system as recited in claim 6, wherein the electrical connection system comprises a portion of a card edge connector.

9. The electrical connection system as recited in claim 6, wherein the at least one open portion of the signal contact pad defines from about fifty percent to about seventy five percent of a total area defined by the signal contact pad.

10. The electrical connection system of claim 6, wherein, for one or more predetermined data rates, each inductive trace and associated signal contact pad collectively implement an impedance that substantially matches an impedance associated with the complementary element to which that inductive trace and signal contact pad are electrically connected.

11. The electrical connection system of claim 6, wherein, for one or more predetermined data rates, each inductive trace and associated signal contact pad collectively implement an impedance that substantially matches an impedance of the signal line to which that inductive trace and signal contact pad are electrically connected.

12. The electrical connection system of claim 6, wherein the compensating series inductance associated with the inductive trace is a function of a length and a width of that inductive trace.

13. The electrical connection system of claim 6, wherein a coupling, between a contact pad and a complementary connector, cooperates with the inductive trace connected to that contact pad to collectively implement an average impedance value based in part on the offset portion of the shunt capacitance, and the average impedance value substantially matches a nominal impedance of an external transmission line of the electrical device.

14. The electrical connection system of claim 6, wherein the non-data contact pad is a ground contact pad.

15. The electrical connection system of claim 14, further comprising a trace connected to the ground contact pad and disposed on the circuit board.

16. The electrical connection system of claim 15, wherein the trace connected to the ground contact pad is configured so as to have an associated inductance that facilitates a reduction of shunt capacitance.

17. The electrical connection system of claim 6, wherein the non-data contact pad is a power contact pad.

18. The electrical connection system of claim 6, further comprising at least one signal contact pad directly connected to a corresponding signal line and disposed on the circuit board.

19. The electrical connection system of claim 6, further comprising a ground plane mounted on an opposite side of a dielectric layer of the circuit board from the plurality of contact pads and the plurality of inductive traces, wherein the ground plane is configured and arranged to affect a strength of a capacitive field associated with at least one of: at least one inductive trace; and, at least one signal contact pad.

20. An electrical connection system suitable for use in connection with high-frequency communication signals, the electrical connection system comprising:
 a circuit board;
 a plurality of signal contact pads disposed on the circuit board configured to interact with complementary elements of an electrical device such that a coupling between one of the signal contact pads and one of the complementary elements is defined that has an associated impedance discontinuity, wherein the signal contact pad associated with the coupling defines at least one open portion through which signals would otherwise pass when the connection system is in a fully coupled configuration, but for an absence of conductive material in the at least one open portion;
 a voltage supply contact pad disposed on the circuit board and configured to interact with a complementary element of the electrical device, the voltage supply contact pad being substantially free of any open portions;
 a plurality of inductive traces disposed on the circuit board and connected to the plurality of contact pads, one of the inductive traces having a geometry configured to implement a reduction in the impedance discontinuity; and
 a plurality of signal lines disposed on the circuit board and connected to the plurality of inductive traces.

21. The electrical connection system of claim 20, wherein the signal contact pad defines a plurality of open portions through which signals cannot pass in the fully coupled configuration and wherein the voltage supply contact pad is configured to supply at least one of a ground reference and a predetermined voltage level to the circuit board.

22. The electrical connection system of claim 21, wherein the plurality of open portions collectively define at least a portion of a cross-hatch pattern.

23. The electrical connection system of claim 21, wherein the plurality of open portions comprises a plurality of openings, each of which is generally in the shape of a parallelogram.

24. The electrical connection system of claim 21, wherein the plurality of open portions collectively define at least a portion of a zigzag pattern.

25. The electrical connection system of claim 20, wherein each inductive trace has a width no greater than about thirty five percent of a width of the signal line connected to that inductive trace.

26. The electrical connection system of claim 20, wherein each inductive trace has a width no greater than about twenty five percent of a width of the signal line connected to that inductive trace.

27. The electrical connection system of claim 20, wherein each inductive trace is associated with a corresponding compensating series inductance, and the impedance discontinuity associated with each inductive trace is susceptible to reduction by use of the compensating series inductance to offset a portion of a shunt capacitance associated with the corresponding coupling.

28. The electrical connection system of claim 20, further comprising a ground plane mounted on an opposite side of a dielectric layer of the circuit board from the plurality of contact pads and the plurality of inductive traces, wherein the ground plane is configured and arranged to affect a strength of a capacitive field associated with at least one of: at least one inductive trace; and, at least one signal contact pad.

* * * * *

UNITED STATES PATENT AND TRADEMARK OFFICE
CERTIFICATE OF CORRECTION

PATENT NO. : 7,453,338 B2  
APPLICATION NO. : 11/533676  
DATED : November 18, 2008  
INVENTOR(S) : Aronson Page 1 of 2

It is certified that error appears in the above-identified patent and that said Letters Patent is hereby corrected as shown below:

Title Page  
Item 57, line 5, after "disposed", remove [a]

Column 2  
Line 29, change "now shown in FIG. 1" to --not shown in FIG. 1--  
Line 61, change "202-3" to --204-2--

Column 3  
Line 36, change "hose PCB" to --host PCB--  
Line 46, after "disposed", remove [a]

Column 4  
Line 38, after "time-domain reflectivity graph", add --300--

Column 5  
Line 28, change "describe for FIG. 2" to --described for FIG. 2--

Column 6  
Line 6, change "frequence" to --frequency--  
Line 11, change "FIG. 5" to --FIG. 4--  
Line 12, change "to a respective signal contact pad" to --to respective signal contact pads--  
Line 13, change "404-$n$. the" to --404-$n$. The--  
Line 31, change "both he width" to --both the width--

Column 7  
Line 22, change "is achieve" to --achieved--  
Line 58, change "603-$n$" to --602-$n$--  
Line 60, change "preferably by least" to --preferably by at least--

Signed and Sealed this  
Twenty-second Day of February, 2011

David J. Kappos  
*Director of the United States Patent and Trademark Office*

Column 8
Line 26, change "ground place" to --ground plane 714--

Column 9
Line 7, change "multiplexors" to --multiplexers--
Line 41, change "ground plane" to --ground plane 714--
Line 54, change "is not be construed as limited" to --is not to be construed as limiting--